United States Patent
Nakamura

(10) Patent No.: US 7,054,159 B2
(45) Date of Patent: May 30, 2006

(54) PRINTED WIRING BOARD HAVING HEAT RADIATING MEANS AND METHOD OF MANUFACTURING THE SAME

(75) Inventor: Satoshi Nakamura, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 422 days.

(21) Appl. No.: 09/818,686

(22) Filed: Mar. 28, 2001

(65) Prior Publication Data

US 2001/0026441 A1 Oct. 4, 2001

(30) Foreign Application Priority Data

Mar. 29, 2000 (JP) .................. P. 2000-090183

(51) Int. Cl.
*H05K 7/20* (2006.01)

(52) U.S. Cl. ................ 361/719; 361/704; 361/707; 257/706; 174/16.3; 165/80.3; 165/185

(58) Field of Classification Search ................ 361/704, 361/707, 712–714, 717–720, 760; 257/706, 257/712, 713, 721, 722; 174/16.1, 16.3, 174/252, 16.2; 165/80.3, 104.35, 185

See application file for complete search history.

(56) References Cited

U.S. PATENT DOCUMENTS

| 5,258,887 A | * | 11/1993 | Fortune .................... 361/720 |
| 5,506,755 A | * | 4/1996 | Miyagi et al. ............. 361/720 |
| 5,708,566 A | * | 1/1998 | Hunninghaus et al. ...... 361/764 |
| 6,058,013 A | * | 5/2000 | Christopher et al. ....... 361/704 |
| 6,084,776 A | * | 7/2000 | Cuntz et al. ............... 361/707 |
| 6,201,701 B1 | * | 3/2001 | Linden et al. ............. 174/252 |
| 6,205,028 B1 | * | 3/2001 | Matsumura ................ 174/252 |
| 6,212,071 B1 | * | 4/2001 | Roessler et al. ........... 361/704 |
| 6,222,732 B1 | * | 4/2001 | Jakob et al. ............... 361/704 |
| 6,226,183 B1 | * | 5/2001 | Weber et al. .............. 361/704 |
| 6,260,610 B1 | * | 7/2001 | Biber et al. ............... 165/80.3 |
| 6,305,463 B1 | * | 10/2001 | Salmonson ................ 165/80.3 |

FOREIGN PATENT DOCUMENTS

| JP | 404113695 A | * | 4/1992 | ................ 361/720 |
| JP | 405082686 A | * | 4/1993 | ................ 257/706 |

* cited by examiner

*Primary Examiner*—Boris Chervinsky
(74) *Attorney, Agent, or Firm*—Morgan, Lewis & Bockius LLP

(57) ABSTRACT

In the present invention, a printed wiring board with an electronic component mounted on a circuit board in which the electronic component is provided with a heat radiating plate for conducting heat internally generated, includes a heat radiating device mounted at a position corresponding to the electronic component on a rear surface of the circuit board.

18 Claims, 7 Drawing Sheets

PRINTED WIRING BOARD HAVING HEAT RADIATING MEANS AND METHOD OF MANUFACTURING THE SAME

BACKGROUND OF THE INVENTION

1. Field of the Invention

This invention relates to a printed wiring board incorporating an electronic component which radiates heat by itself, particularly to a semiconductor device having a heat radiating plate, and more particularly to a printed wiring board having a heat radiating means capable of effectively radiating heat from the semiconductor device.

2. Description of the Related Art

Conventionally, for example, a printed wiring board formed as a hybrid IC used in an AC/DC or DC/DC converter circuit incorporates a resin-packaged semiconductor device which includes a semiconductor chip generating more heat during the operation and is mounted on a circuit board. Such a semiconductor device includes a heat radiating plate which radiates externally heat generated by the semiconductor chip.

An example of the printed wiring board incorporating a semiconductor device having the heat radiating mounted on a circuit board is shown in FIG. 7. FIG. 8 is a sectional view taken along line VII—VII in FIG. 7. In a hybrid IC 100 illustrated in FIG. 7, as shown in FIG. 8, a resin-packaged semiconductor device (hereinafter simply referred to as a semiconductor device) 1 is mounted by its surface on a circuit board 102. The semiconductor device 1 incorporates a metallic heat radiating plate 11 which is partially exposed externally from a resin package 10.

The semiconductor device 1, as seen from FIG. 8, includes a semiconductor chip 12, a plurality of inner leads 13 (only one is shown in FIG. 8) which are electrically communicated with the semiconductor chip 12, a resin package 10 which wraps the semiconductor chip 12 and the inner leads 13, a plurality of outer leads 14 (only one is shown in FIG. 8) which are successive to the inner leads 13 and extended out from the resin package 10, and a heat radiating plate 11 which is built in the resin package 10 so as to extend out from the resin package 10 so that heat generated from the semiconductor chip 12 is externally radiated.

On the other hand, as shown in FIG. 7 on the circuit board 102, a wiring pattern (not shown) corresponding to each of the outer leads 14 is formed, and a copper pattern 20 is formed on which the heat radiating plate 11 of the semiconductor device 1 is formed.

As seen from FIG. 8, an upper electrode 12a is formed on the upper surface of the semiconductor chip 12. This upper electrode 12a is electrically connected to the upper face of each of the inner leads 13 through a wire 15. The inner lead 13 is extended out from the resin package 10 and bent to constitute the outer lead 14. The outer lead 14 is soldered to the wiring pattern.

As seen from FIGS. 7 and 8, The above heat radiating plate 11 includes a square die pad 11a and a heat radiating portion 11b for radiating heat generated when the semiconductor device 1 mounted in the circuit board 102 is driven. The semiconductor chip 12 is bonded on the die pad 11a. The lower surfaces of the die pad 11a and the heat radiating portion 11b are soldered on the copper foil pattern 20.

However, since the copper foil pattern 20 and the circuit board 102 have a smaller specific heat than air, the heat from the heat radiating plate 11 is apt to conduct to the circuit board 102 through the copper foil pattern 20 and is stored there. In order to prevent storage of heat in the circuit board 102 to radiate heat effectively, it is possible to propose to increase the area of the copper foil pattern 20. However, an increase in the area of the copper foil pattern 20 leads to an increase in the area of the circuit board 102. In order to satisfy the demand of reduction in the size and thickness of each of various appliances, the reduction in the size and thickness has been demanded also in an electronic component and a printed wiring board. However, the increase in the area of the copper foil pattern 20 can not satisfy the demand described above.

SUMMARY OF THE INVENTION

This invention has been accomplished under the circumstance described above.

An object of this invention is to provide a printed wiring board having a heat radiating means which can effectively radiate heat generated in an electronic component without upsizing the printed wiring board.

In order to attain the above object, in accordance with this invention, the following technical contrivances are offered.

The printed wiring board having heat radiating means provided by this invention is a printed wiring board with an electronic component mounted by its surface on a circuit board in which the electronic component is provided with a heat radiating plate for conducting heat internally generated, characterized in that the heat radiating means is mounted by its surface at a position corresponding to the electronic component on a rear surface of the circuit board.

In the above printed wiring board provided by this invention, the heat generated internally in the electronic component mounted by its surface on the surface of the circuit board is conducted to the heat radiating means through the circuit board from the heat radiating plate and externally radiated form the heat radiating means. Therefore, the heat is not stored in the circuit board but can be radiated effectively. In addition, since the heat radiating means is mounted by its surface on the rear surface of the circuit board, the printed wiring board with the heat radiating means is not upsized in the area, and there is no need of fixing the heat radiating means by the other member such as a screw. This enhances the manufacturing efficiency.

In a preferred embodiment, the heat radiating means is adapted so that it can be soldered to the circuit. Therefore, the heat radiating means can be automatically mounted using an existing mounter when it is mounted on the circuit board. This also enhances the manufacturing efficiency.

In another preferred embodiment, the heat radiating means has a plated layer. Therefore, the heat radiating means can be soldered to the circuit board via the plated layer.

The plated layer may contain either one or both of tin and nickel.

In such a configuration in which the heat radiating means may be made of metal such as aluminum and iron which is apt to conduct heat for more effective heat radiating, it can be soldered.

In a further preferred embodiment, the heat radiating means is made of metal, and is provided, on a rear side thereof, with an attaching plate which can be brought into contact by its surface with the circuit board on a rear side thereof and on a front side thereof, with a plurality of fins for radiating heat.

In such a configuration, the heat radiating means, which has a plurality of fins, can have an increased surface to conduct heat, thereby radiating heat effectively.

In a further preferred embodiment, the plurality of fins for radiating heat forms a corrugated cross-section being uniformly shaped in such a way that a long-length of a belt-shaped hoop material is extruded and cut at a prescribed length.

This permits the structure of the heat radiating means to be simplified and improves the manufacturing efficiency.

In a further preferred embodiment, a first heat radiating pattern for conducting heat is formed at a position on a front surface of the circuit board corresponding to the electronic component, and the heat radiating plate of the electronic component is connected to the first heat radiating pattern by soldering.

In a preferred embodiment, a second heat radiating pattern for conducting heat is formed at a position on a rear surface of the circuit board corresponding to the electronic component, and the heat radiating means is mounted on the circuit board in such a way that the second heat radiating pattern is soldered to its attaching face.

Preferably, the first heat radiating pattern and the heat radiating pattern are connected to each other via through-holes which passing through the circuit board.

In such a configuration, the heat from the heat radiating from the electronic component is continuously conducted to the heat radiating means via the first heat radiating pattern, through-hole and/or second heat radiating pattern. Thus, the heat is not stored in the circuit board, but can be conducted effectively.

The first heat radiating pattern and second heat radiating pattern may be common patterns in wiring patterns which constitute circuits formed on the circuit board. In this case, there is no need of separately providing the heat radiating pattern. This improves the manufacturing efficiency and prevents the printed wiring board having the heat radiating from being upsized.

In a further preferred embodiment, the heat radiating means is attached to a circuit board in such a manner that the fins stand when the circuit board is used in its standing state.

In such a configuration, where the entire printed wiring board having the heat radiating means is covered with powder coating for protection from its being damaged, the grooves between the fins can be prevented from being buried in the coating.

The above and other objects and features of this invention will be more apparent from the following description taken in conjunction with the accompanying drawings.

DESCRIPTION OF THE PREFERRED EMBODIMENTS

Figure 1:
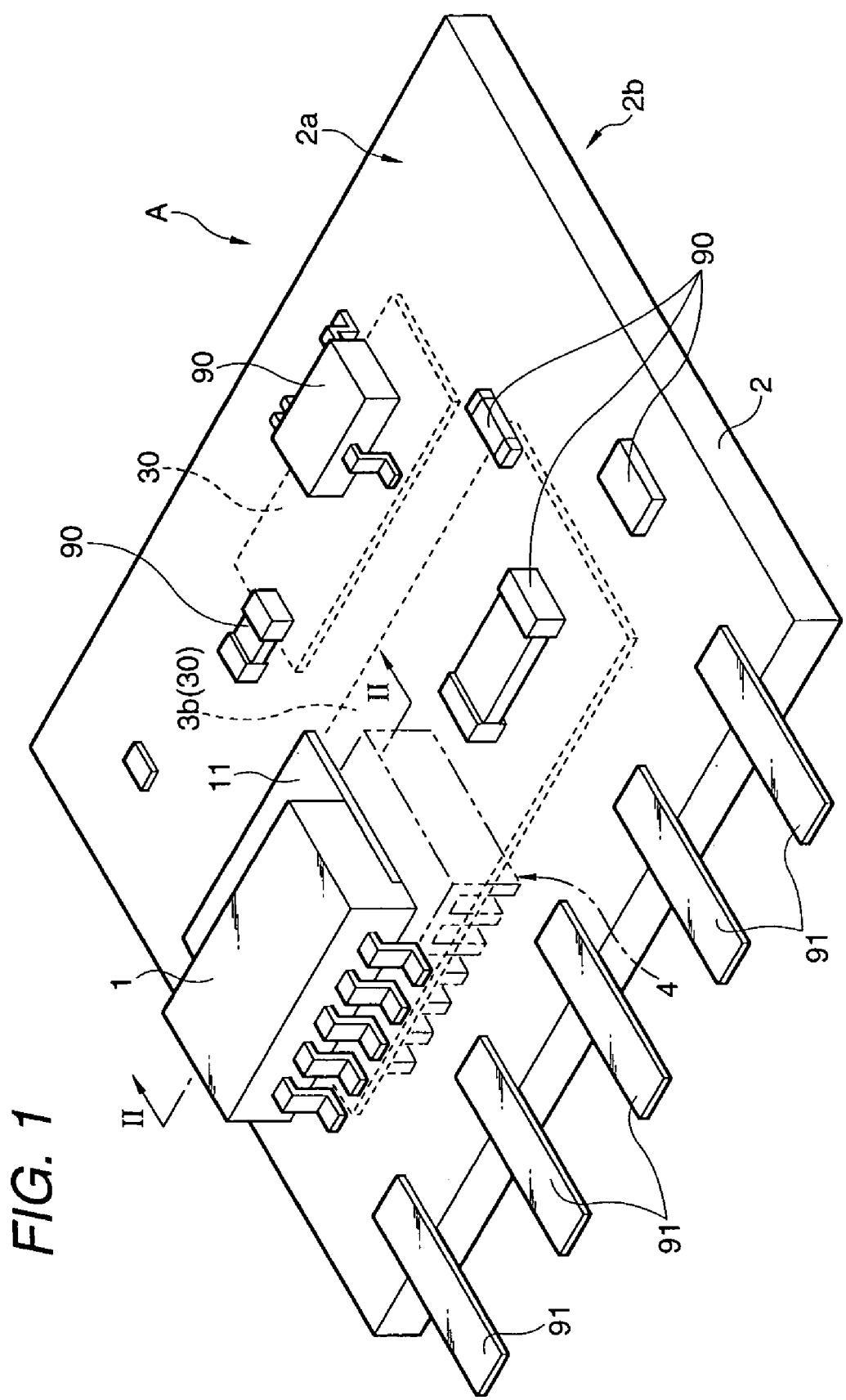
FIG. 1 is an entire perspective view showing an embodiment of a printed wiring board having a heat radiating means according to this invention.

Now referring to the drawings, an explanation will be given of preferred embodiments of this invention.

Figure 2:
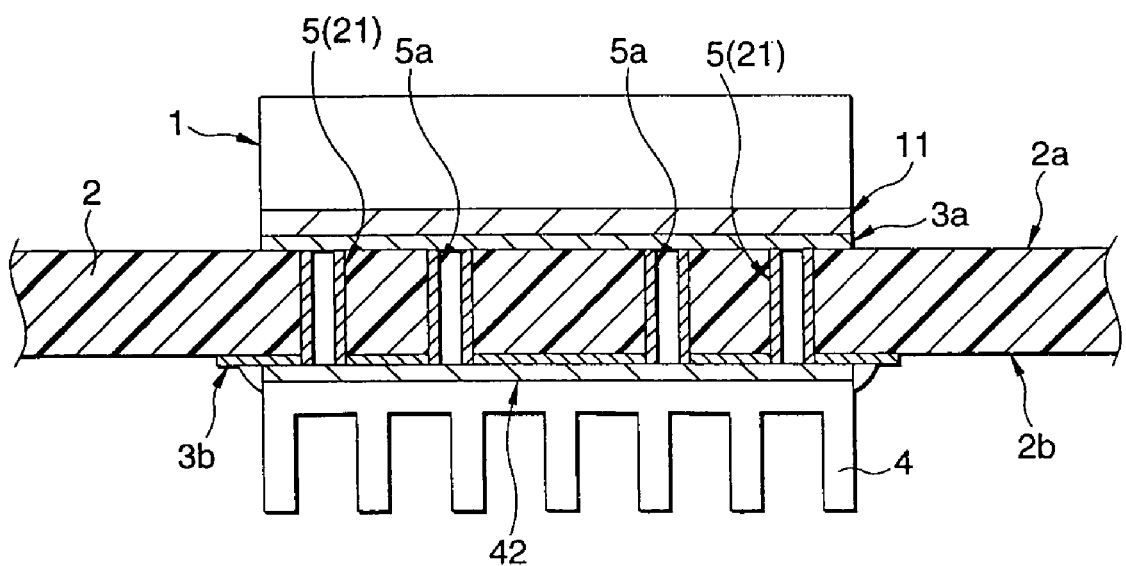
FIG. 2 is a sectional view taken along line II—II in FIG. 1.
Figure 3:
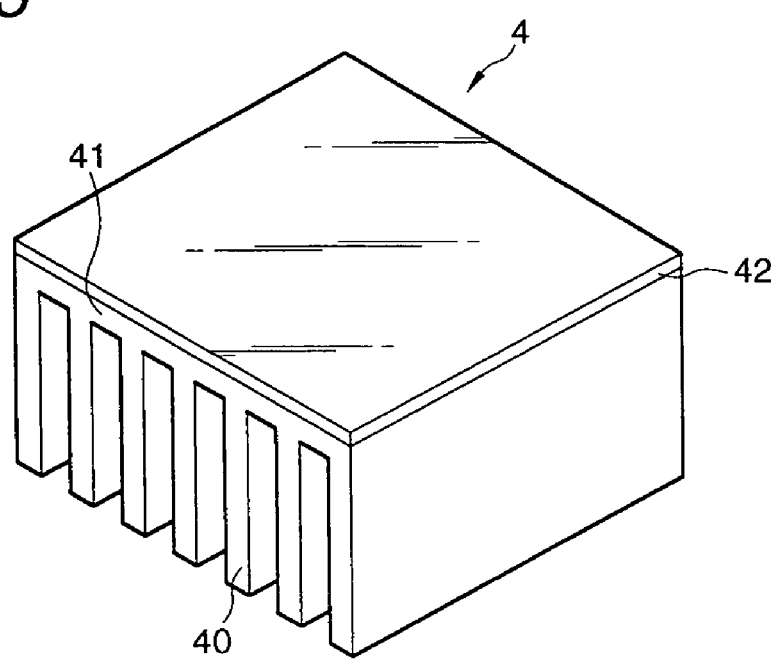
FIG. 3 is an enlarged perspective view of the heat radiating means in FIG. 1.
Figure 4:
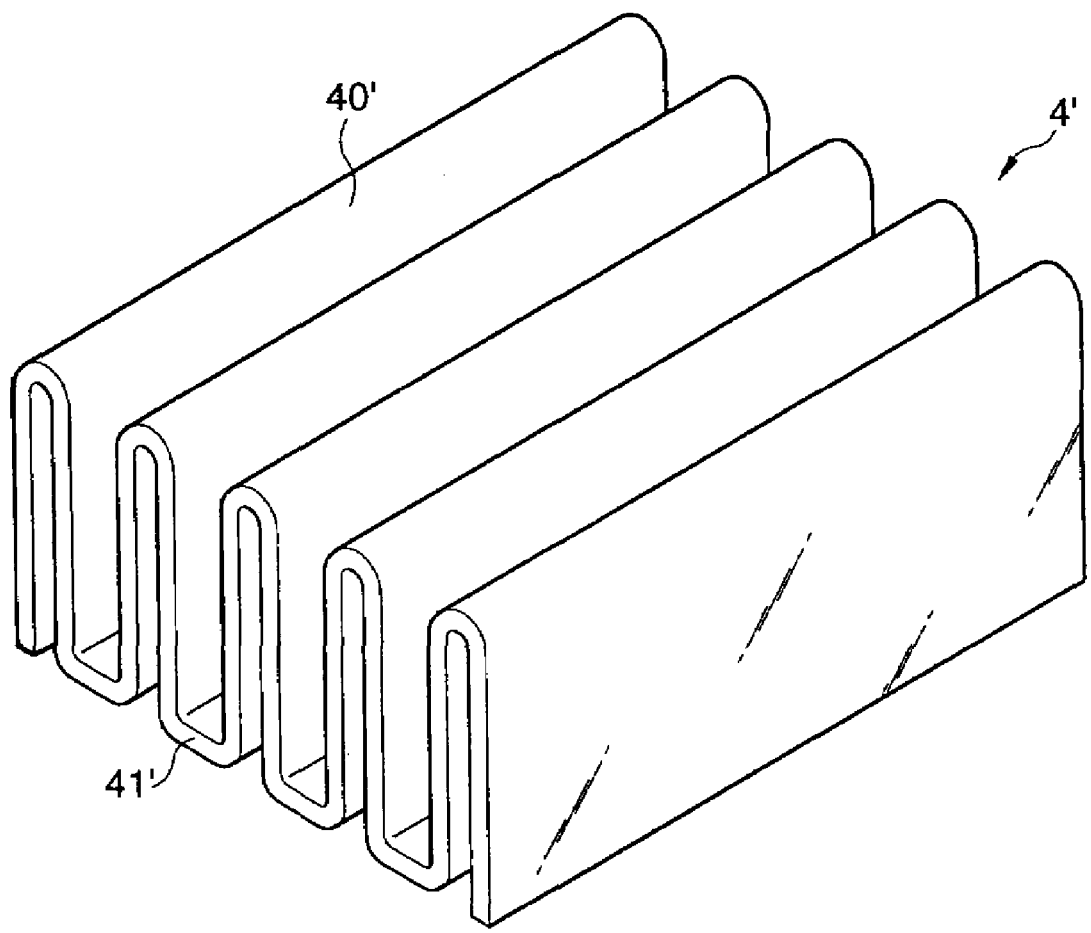
FIG. 4 is a perspective view showing a heat radiating means in another embodiment of a printed wiring board according to this invention.

FIG. 1 is an entire perspective view showing an embodiment of a printed wiring board having a heat radiating means according to this invention; FIG. 2 is a sectional view taken along line II—II in FIG. 1; FIG. 3 is an enlarged perspective view of the heat radiating means in FIG. 1; and FIG. 4 is a perspective view showing a heat radiating means in another embodiment of a printed wiring board according to this invention. This embodiment is directed to the case where the printed wiring board is constructed as a hybrid IC used in an AC/DC or DC/DC converter, and the semiconductor device which generates heat internally is mounted by its surface as an electronic component. In these figures, like reference numerals refer to like member and elements in the figures referred to for explanation of the conventional printed wiring board.

Figure 8:
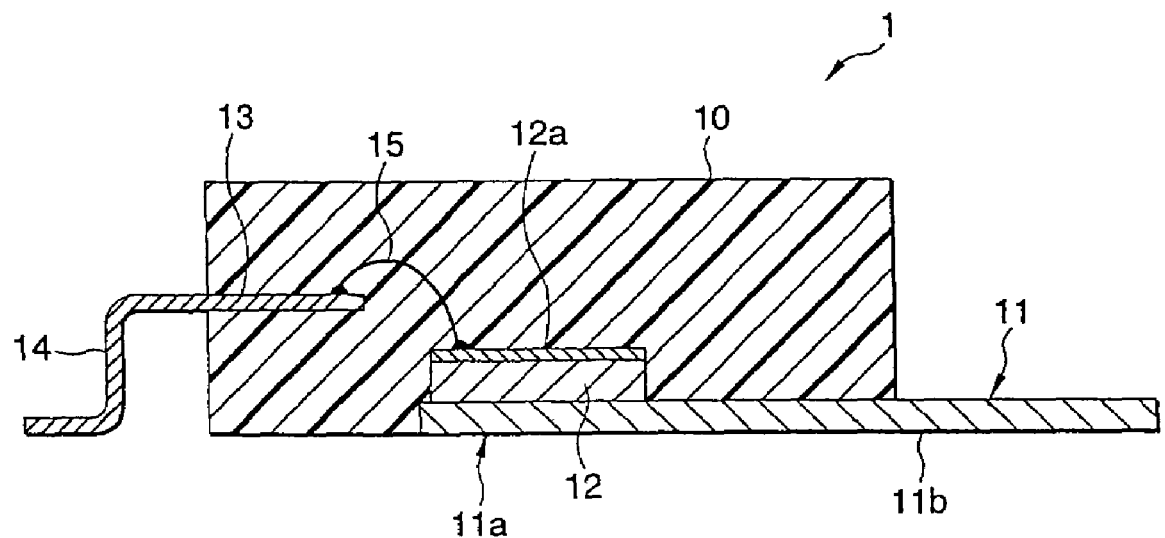
FIG. 8 is a sectional view taken along line VII—VII in FIG. 7.

As seen from FIG. 1, a printed wiring board A having a heat radiating means (hereinafter referred to as a wiring board) is constructed as a hybrid IC used in an AC/DC or DC/DC converter. Such an IC includes a semiconductor device 1 incorporating a semiconductor chip 12 (FIG. 8) which generates more heat during the driving. This semiconductor device 1 is the same as the semiconductor device used in the conventional wiring printed board described above, and includes a heat radiating plate 11 for externally radiating heat internally generated.

As seen from FIG. 1, in the wiring board A, the semiconductor device 1 is mounted by its surface on a front surface 2a of a board 2, and a heat radiating means 4 is mounted by its surface on a rear surface 2b of the board 2 at the position corresponding to the semiconductor device 1.

In this embodiment, the board 2 is made of glass epoxy which is a glass fiber fixed by epoxy resin. It is reinforced so that it does not bend or contract. On the circuit board 2, a wiring pattern (not shown) is formed which connects the semiconductor device and other components constituting a circuit.

The wiring pattern is formed of a conductor of a thin copper foil. It can be formed in such a manner that after a conductive film has been formed on the entire surface of the board 2, an unnecessary portion is removed by photolithography. Terminals 91 each protruding from the vicinity of one end of the board 2 is soldered to a prescribed portion of the wiring pattern. These terminals 91 are connected to an electronic appliance using the wiring board A.

Further, as seen from FIG. 2, in the circuit board 2, on the front surface 2a thereof, a first heat radiating pattern 3a which conducts heat can be formed. In this case, the above semiconductor device 1 can be mounted by its surface on the circuit board 2 in such a manner that the heat radiating plate 11 is soldered onto the first radiating pattern 3a.

In this embodiment, the first heat radiating pattern 3a, which has the same area as that of the heat radiating plate 11, is kept in contact with the entire heat radiating plate 11. Therefore, the first heat radiating pattern 3a can conduct the heat generated from the heat radiating plate 11 effectively.

The first heat radiating pattern 3a, which is preferably made of a copper foil like the wiring pattern, can radiate heat more effectively. The first heat radiating pattern 3a can be formed simultaneously with the wiring pattern as a part thereof, and hence is not required to be formed as a separate component. This improves the production efficiency.

Further, in the circuit board 2, on the rear surface 2b thereof, a second heat radiating pattern 3b which conducts heat can be formed. In this case, the heat radiating means 4 described later can be mounted by its surface on the circuit board 2 in such a manner that its attaching face can be soldered to the second heat radiating pattern 3b.

In this embodiment, the second heat radiating pattern 3b, which has an area not smaller than the heat radiating plate 11, is formed on the rear surface 2b of the circuit board 2 at the entire portion corresponding to the heat radiating plate 11. Thus, by forming the second heat radiating pattern 3b on the rear surface 2b of the circuit board 2, heat can be conducted effectively without upsizing the wiring board A.

Further, as seen from FIG. 1, the second heat radiating pattern 3b can be formed as a common pattern 30 which serves as a grounding electrode in the above wiring pattern. Namely, like the first heat radiating pattern 3a, the second heat radiating pattern 3b can also be formed with the improved production efficiency.

As seen from FIG. 2, the first heat radiating pattern 3a and the second heat radiating pattern 3b can be connected to each other via through-holes 5, which pass through the circuit board 2. By means of the copper foil formed on the inner wall of each through-hole, the heat from the first heat radiating pattern 3a can be not conducted to the circuit board but conducted to the second heat radiating pattern 3b.

As seen from FIG. 2, the above through-holes 5 are formed in such a manner that holes 21 which penetrate the circuit board 2 are formed and the copper foil 5a is applied to the inner wall of each of the holes 21. Namely, the through-holes 5 are the same as ordinary through-holes which are used to communicate the wiring patterns on the front surface 2a and rear surface 2b of the circuit board 2. For this reason, the through-holes 5 can be formed simultaneously with these ordinary through-holes. They are not required to be formed as separate components. This improves the production efficiency.

Further, the through-holes 5 communicate the first heat radiating pattern 3a and the second heat radiating pattern 3b by means of the copper foil 5a formed on the inner wall of each of the holes 21. Generally, the copper foil 5a has specific heat that is smaller than that of the circuit board 2. Therefore, the heat from the first heat radiating pattern 3a cannot be radiated to the circuit board 2, but conducted to the copper foils 5a of the through-holes 5. Further, the plurality of through-holes 5 can be provided to increase their areas in contact with the first heat radiating pattern 3a and the second heat radiating pattern 3b. This permits heat to be conducted effectively.

In the embodiment shown in FIG. 2, the first heat radiating pattern 3a, the second heat radiating pattern 3b and the through-holes 5 are formed commonly. However, of these three components, only one component or any two components in combination can be formed.

The heat radiating means 4 serves to radiate the heat conducted from the heat radiating plate 11 of the semiconductor device 1. In this embodiment, this heat radiating means 4 is made of iron having smaller specific heat than the circuit board 2. Therefore, the heat conducted to the second heat radiating pattern 3b is not radiated to the circuit board 2 but conducted to the heat radiating means 4. As seen from FIG. 3, the heat radiating means 4 is provided with a plurality of fins 40 in parallel to each other which can increase the surface area exposed to air, thereby improving the heat radiating effect.

Further, as seen from FIG. 3, the heat radiating means 4 is provided with a supporting portion 41 supporting the respective fins 40 vertically extended therefrom. In this embodiment, the supporting portion 41 is formed in a simple structure of a square shape in its plan view. The supporting portion 41 has an area not smaller than that of the heat radiating plate 11 of the semiconductor device 1 so that it corresponds to the entire heat radiating plate 11, thereby improving the heat radiating effect.

Further, as seen from FIG. 3, the supporting plate 41 of the heat radiating means 4 can also be soldered to the heat radiating pattern 3b through a plated layer 42 formed on the plane to attached to the second heat radiating pattern 3b.

In this embodiment, the plated layer 42 may be a layer containing nickel and tin. For this reason, the heat radiating means 4 made of iron can be soldered to the second heat radiating pattern 3b by means of the metallic bond.

Otherwise, the plated layer 42 can be formed in a double-layer structure in which the surface of the supporting portion is first plated with a layer containing nickel and thereafter plated with another layer containing tin.

Further, as seen from FIG. 4, a heat radiating means 4' includes a plurality of fins 40' which forms a corrugated cross-section being uniformly shaped in such a way that a long-length of a belt-shaped hoop material is extruded and cut at a prescribed length, thereby improving the production efficiency. The corrugated member consists of a plurality of fins 40'. These fins 40' of the heat radiating means 4' each are formed in a rectangular-shape in section which can have a larger area exposed to air. It is needless to say that the heat radiating means 4' has a plated layer like the heat radiating means 4. The corrugated member may be cut when the heat radiating means 4' is mounted by its surface on the circuit board 2. In this case, if a mounter equipped with a hoop material cutting machine, the heat radiating means 4' can be mounted by its surface while the hoop material is being automatically cut. 41' is a supporting member.

The heat radiating means 4 or 4' can be soldered as described above so that it can be automatically mounted simultaneously when the semiconductor device 1 and other components are mounted using the mounter. Now referring to FIGS. 5 and 6, an explanation will be given of a method of automatically mounting the heat radiating means 4 on the circuit board 2. It is assumed that the circuit board 2 is previously machined by the following procedure.

First, after the circuit board 2 has been formed in a prescribed size, the wiring pattern, first heat radiating pattern 3a and second heat radiating pattern 3b are formed on the surfaces 2a and 2b of the circuit board 2. Next, the circuit board 2 is covered with an insulating resin film called "green resist". In this case, the first and the second heat radiating patterns 3a and 3b and a conductive pad to which the terminals of the other components 90 are to be soldered are not covered with the green resist, but exposed. After through-holes have been made, creamy solder is applied to the portions of the conductive pad and the first and the second heat radiating patterns 3a and 3b.

Figure 5:
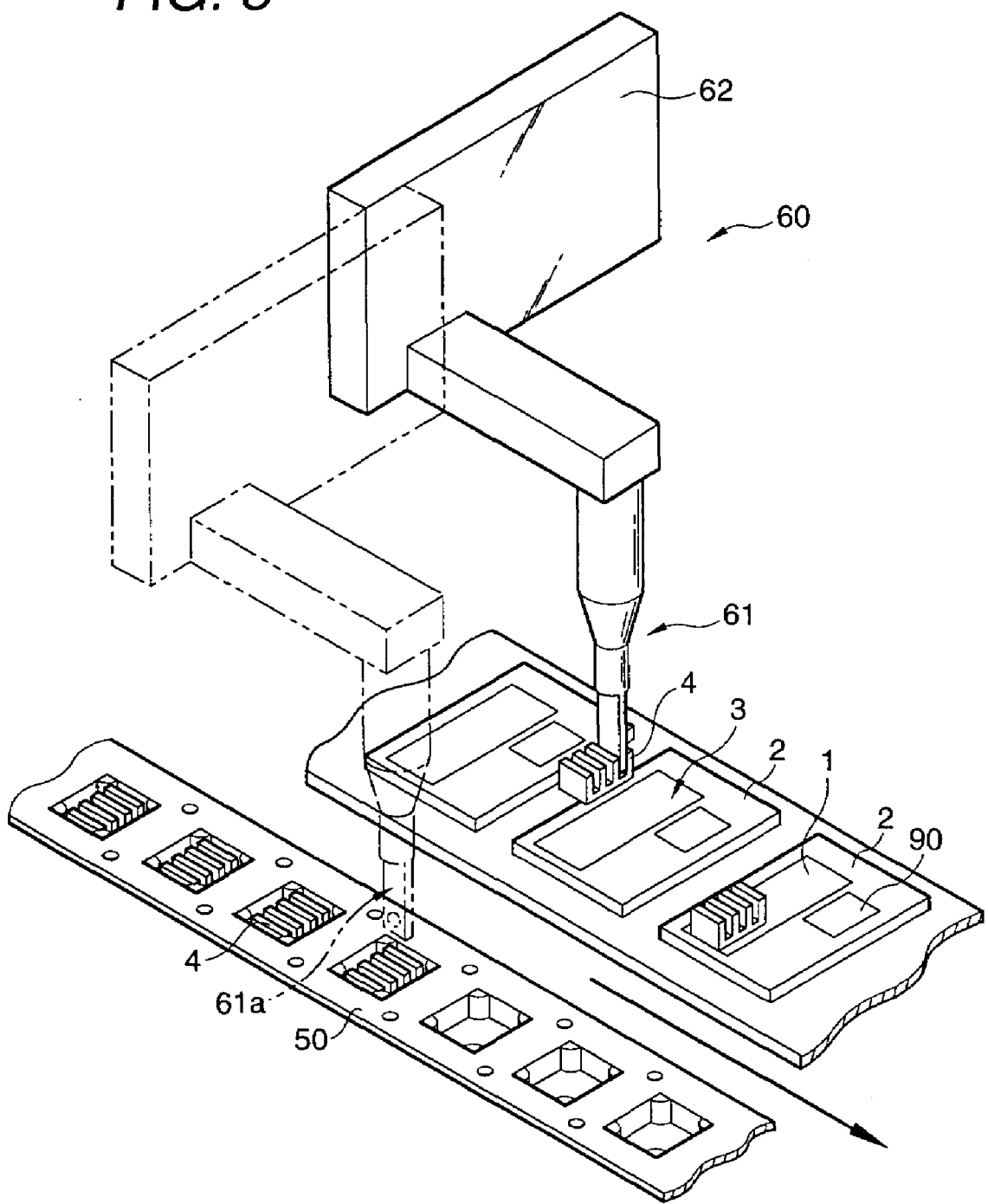
FIG. 5 is a schematic perspective view for explaining the method of mounting the heat radiating means on a printed wiring board.
Figure 6:
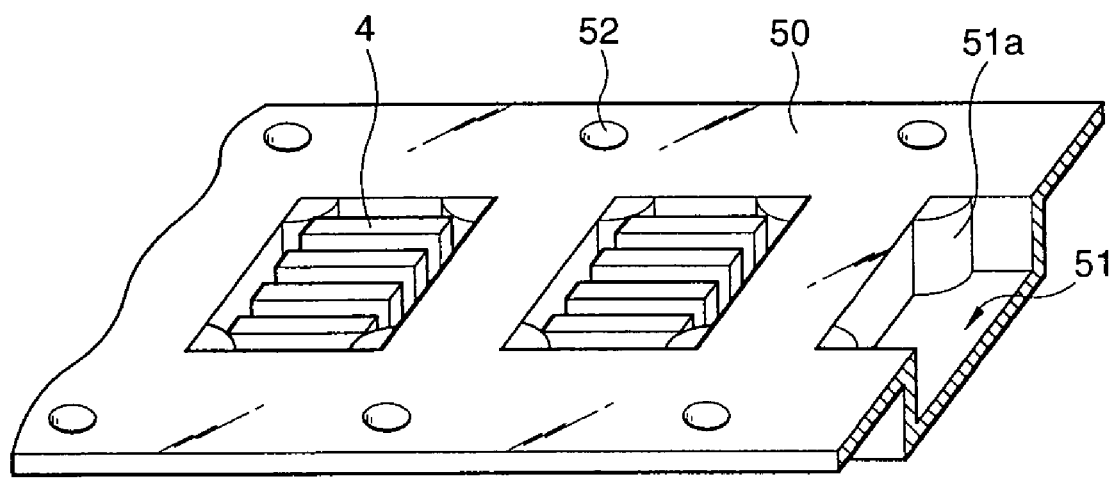
FIG. 6 is an enlarged perspective view of the tape in FIG. 5.
Figure 7:
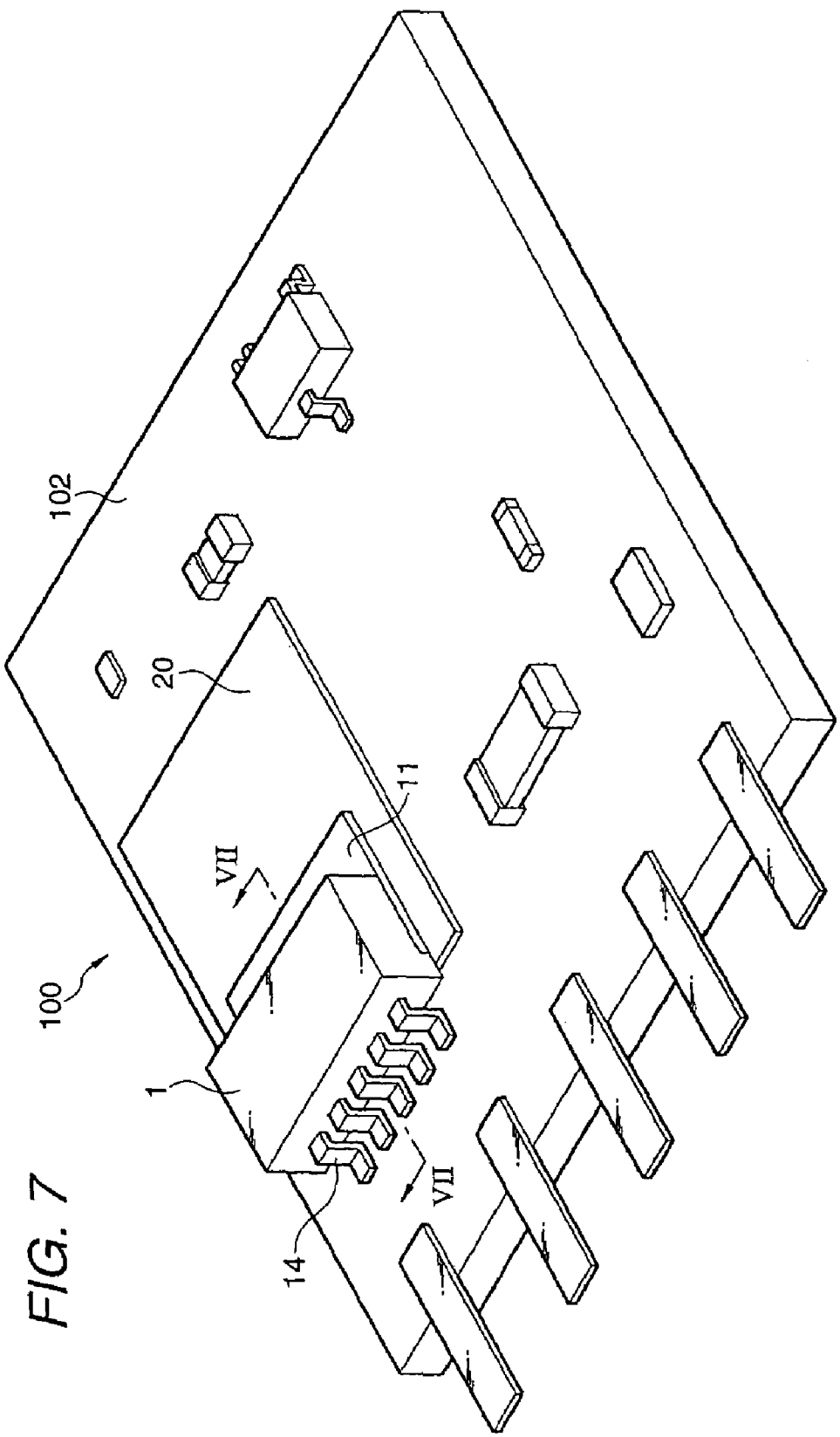
FIG. 7 is an entire perspective view of an example of the printed wiring board in which a semiconductor device having a heat radiating plate is mounted on a circuit board.

As seen from FIG. 5, with the second heat radiating pattern 3a oriented up, the circuit board 2 machined by the above procedure is automatically transferred to an attaching step of the heat radiating means 4. Prior to this step, the semiconductor device 1 and the other components 90 may be attached to the circuit board 2. In this embodiment, although a single board has been transferred, this circuit board 2 may be an integral board composed of a plurality of sheets. In this case, as described later, after the heat radiating means 4 and the other components 90 have been mounted, the integral board may be separated into individual wiring plates A.

On the other hand, after the heat radiating means 4 has been machined in a prescribed shape and size, with its attaching face plated with the plated layer 42 in this embodiment, the heat radiating means 4 is automatically transferred to the step of attaching it.

During the transfer, with its attaching face oriented down, the heat radiating means 4 is pitch-transferred with the aid of e.g. an emboss tape 50 of synthetic resin such as polyimide. As seen from FIG. 6, the emboss tape 50 has a plurality of housing pockets 51 for advancing at regular intervals at middle positions in a width direction. The emboss tape 50 has also a plurality of sprocket holes 52 at regular intervals in the vicinities of both ends in the width direction. With transfer sprockets of a transfer mechanism (not shown) engaged with the sprocket holes 52 the emboss tape 50 is transferred in a prescribed direction.

In this embodiment, each of the housing pockets 51 has four swelling portions 51a formed at its four corners.

Since the heat radiating means 4 has a simple structure of a square shape in its plan view, it can be held among these swelling portions 51a so that it is not moved so greatly within the housing pocket 51. In this embodiment, although the housing pocket 51 has four swelling pockets, the swelling portions be provided at only two corners on the one side in the width direction so that an existing emboss tape for transferring the transistor and the others can be employed.

The heat radiating means 4 thus transferred with the aid of the emboss tape 50 is placed on the heat radiating pattern 3 on the circuit board 2.

In this embodiment, the above mounter 60 is provided with a vacuum-sucking collet 61. The heat radiating means 4 is sucked by the vacuum collet 61 and moved upward so that it is taken out from the emboss tape 50. In this embodiment, a tip 61a of the vacuum sucking collet 61 is formed in a thin pipe shape of "rectangular" in section. The tip 61a has a thickness that can be inserted into a groove between the adjacent fins 40 of the heat radiating means 4. The tip 61a has an opening on the plane corresponding to the fin 40. When the interior of the vacuum sucking collet 61 is evacuated to a vacuum, the side of the fin 40 is sucked to the opening so that the heat radiating means 4 can be sucked in the vacuum sucking collet 61.

After the heat radiating means 4 has been sucked from the emboss tape 50, it is placed on the circuit board 2 with the aid of the movement of a sliding member 62 which supports the above vacuum sucking collet 61.

Subsequently, the circuit board 2 is transferred in a reflow furnace and heated there. After the creamy solder has been molten, it is cooled and solidified, thereby completing the mounting. Thus, the above heat radiating means 4 can be automatically mounted by its surface.

The wiring board A formed as described above can be protected by powder coating or the like at the other area than the terminals 91 (FIG. 1).

The powder coating can be formed by the fluid immersing technique in which the wiring board A is immersed in a fluid bath of the powder fluidized with no solvent and thereafter lifted up. According to such a method, with the terminals 91 being grasped, the wiring board A is dried while it is set on end. In this case, if the heat radiating means 4 is mounted on the circuit board in a direction of causing the respective fins 40 to stand, the grooves between the fins 40 can be prevented from being buried in the coating.

The printed wiring board having the heat radiating means described above has been explained as an example of a hybrid IC on which the semiconductor device generating heat internally is mounted. However, the printed wiring board according to this invention can be employed as various kinds of printed wiring boards.

What is claimed is:

1. A printed wiring board with an electronic component mounted on a circuit board in which the electronic component is provided with a heat radiating plate for conducting heat internally generated, comprising:
   a first heat radiating pattern for conducting heat which is formed on a front surface of said circuit board, and connected to said heat radiating plate of the electronic component by soldering;
   a second heat radiating pattern for conducting heat which is formed on a rear surface of said circuit board at a position being opposed to said electronic component, and
   heat radiating means mounted on said second heat radiating pattern by soldering at a position being opposed to the electronic component, wherein
   said heat radiating plate and said first radiating pattern have a same area whereas said second heat radiating pattern has a larger area than that of said first radiating pattern or said heat radiating plate, wherein said heat radiating means is made of metal, and is provided, on a rear side thereof, with a plated layer which is able to be brought into contact with said circuit board and on a front side thereof, with a plurality of fins for radiating heat, wherein said plurality of fins for radiating heat forms a corrugated cross-section being uniformly shaped in such a way that a long-length of a belt-shaped hoop material is extruded and cut at prescribed length, and wherein said second heat radiating pattern is formed apart from the electronic component on the rear surface of said circuit board and serves as a grounding electrode for the electronic component.

2. The printed wiring board according to claim 1, wherein said first heat radiating pattern and said second heat radiating pattern are connected to each other via through-holes which pass through said circuit board.

3. The printed wiring board according to claim 1, wherein said first heat radiating pattern is a common pattern of wiring patterns which constitute circuits formed on said circuit board.

4. The printed wiring board according to claim 1, wherein said second heat radiating pattern is a common pattern of wiring patterns which constitute circuits formed on said circuit board.

5. A printed wiring board, comprising:
   a circuit board;
   an electronic component mounted on said circuit board and including a heat radiating plate for conducting heat internally generated;
   a first heat radiating pattern for conducting heat formed at a position on a front surface of said circuit board corresponding to said electronic component, such that the heat radiating plate of said electronic component is connected to said first heat radiating pattern by soldering;
   a second heat radiating pattern for conducting heat formed at a position on a rear surface of said circuit board corresponding to said electronic component;

a plated layer to which said second heat radiating pattern is soldered; and heat radiating means mounted at a position corresponding to said electronic component on the rear surface of said circuit board, such that said heat radiating means is mounted on said circuit board via said plated layer, wherein said second heat radiating pattern has a larger area than that of said first heat radiating pattern, wherein said heat radiating means is made of metal, and is provided, on a rear side thereof, with a plated layer which is able to be brought into contact with said circuit board and on a front side thereof, with a plurality of fins for radiating heat, wherein said plurality of fins for radiating heat forms a corrugated cross-section being uniformly shaped in such a way that a long-length of a belt-shaped hoop material is extruded and cut at prescribed length, and wherein said second heat radiating pattern is formed apart from the electronic component on the rear surface of said circuit board and serves as a grounding electrode for the electronic component.

6. The printed wiring board according to claim 5, wherein said plated layer contains tin.

7. The printed wiring board according to claim 5, wherein said plated layer contains nickel.

8. The printed wiring board according to claim 5, wherein said plated layer includes a first layer containing nickel and a second layer containing tin.

9. The printed wiring board according to claim 5, wherein said first heat radiating pattern is a common pattern of wiring patterns which constitute circuits formed on said circuit board.

10. The printed wiring board according to claim 5, wherein said second heat radiating pattern is a common pattern of wiring patterns which constitute circuits formed on said circuit board.

11. The printed wiring board according to claim 5, wherein said first heat radiating pattern and said second heat radiating pattern are connected via at least one through hole in heat, and an inner surface of the through hole is covered with a material having a specific heat smaller than that of the printed wiring board.

12. A printed wiring board with an electronic component mounted on a circuit board in which the electronic component is provided with a heat radiating plate for conducting heat internally generated, comprising:

a first heat radiating pattern for conducting heat which is formed on a front surface of said circuit board, and connected to said heat radiating plate of the electronic component by soldering;

a second heat radiating pattern for conducting heat which is formed on a rear surface of said circuit board at a position being opposed to said electronic component, and heat radiating means mounted on said second heat radiating pattern by soldering at a position being opposed to the electronic component, wherein said heat radiating plate and said first heat radiating pattern have a same area whereas said second heat radiating pattern has a larger area than that of said first heat radiating pattern or said heat radiating plate, and wherein said second heat radiating pattern is formed apart from the electronic component on the rear surface of said circuit board and serves as a grounding electrode for the electronic component.

13. The printed wiring board according to claim 12, wherein said heat radiating means is made of metal, and is provided, on a rear side thereof, with a plated layer which is able to be brought into contact with said circuit board and on a front side thereof, with a plurality of fins for radiating heat.

14. The printed wiring board according to claim 13, wherein said plurality of fins for radiating heat forms a corrugated cross-section being uniformly shaped in such a way that a long-length of a belt-shaped hoop material is extruded and cut at prescribed length.

15. The printed wiring board according to claim 12, wherein said first heat radiating pattern and said second heat radiating pattern are connected to each other via through-holes which pass through said circuit board.

16. The printed wiring board according to claim 12, wherein said first heat radiating pattern is a common pattern of wiring patterns which constitute circuits formed on said circuit board.

17. The printed wiring board according to claim 12, wherein said second heat radiating pattern is a common pattern of wiring patterns which constitute circuits formed on said circuit board.

18. The printed wiring board according to claim 13, wherein said fins of said heat radiating means are designed to stand with respect to the circuit board.

* * * * *